United States Patent [19]

Westbrook et al.

[11] Patent Number: 5,330,919
[45] Date of Patent: Jul. 19, 1994

[54] METHOD FOR ELECTRICALLY TESTING A SEMICONDUCTOR DIE USING A TEST APPARATUS HAVING AN INDEPENDENT CONDUCTIVE PLANE

[75] Inventors: Gregory L. Westbrook, Chandler; William M. Williams, Gilbert, both of Ariz.

[73] Assignee: Motorola, Inc., Schaumburg, Ill.

[21] Appl. No.: 14,591

[22] Filed: Feb. 8, 1993

[51] Int. Cl.5 .................. G01R 31/26; H01L 21/66
[52] U.S. Cl. ............................................ 437/8; 324/765
[58] Field of Search ..................... 437/8; 324/158 F

[56] References Cited

U.S. PATENT DOCUMENTS

| 4,763,409 | 8/1988 | Takekawa et al. | 437/8 |
| 5,086,269 | 2/1992 | Nobi | 324/158 F |
| 5,087,877 | 2/1992 | Frentz et al. | 324/158 F |

FOREIGN PATENT DOCUMENTS

| 55-125461 | 9/1980 | Japan | 324/158 F |
| 56-23749 | 3/1981 | Japan | 437/8 |
| 57-162343 | 10/1982 | Japan | 437/8 |
| 58-823453 | 2/1983 | Japan | 437/8 |
| 58-139441 | 8/1983 | Japan | 437/8 |
| 59-164967 | 9/1984 | Japan | 324/158 F |
| 473942 | 3/1992 | Japan | 437/8 |

*Primary Examiner*—O Chaudhuri
*Assistant Examiner*—David E. Graybill
*Attorney, Agent, or Firm*—Joe E. Barbee; Rennie William Dover

[57] ABSTRACT

A method for controlling a characteristic impedance during testing of a semiconductor die (13). The semiconductor die (13) is mounted in a TAB package (10 or 54) wherein the TAB package (10 or 54) lacks a ground plane. A conductive plate (40 or 70) is removably mounted to a test contact fixture (29 or 60). The conductive plate (40 or 70) may be coated with a layer of dielectric material (50, 56, or 74) having a specified thickness. The layer of dielectric material (50, 56, or 74) contacts a plurality of conductive fingers (16). A microstrip transmission line is formed which includes the plurality of conductive fingers (16), the layer of dielectric material (50, 56, or 74), and the conductive plate (40 or 70). The semiconductor die (13) is tested by a computer controlled automatic tester (28).

13 Claims, 3 Drawing Sheets

METHOD FOR ELECTRICALLY TESTING A SEMICONDUCTOR DIE USING A TEST APPARATUS HAVING AN INDEPENDENT CONDUCTIVE PLANE

BACKGROUND OF THE INVENTION

This invention relates, in general, to a method for adjusting characteristic impedances, and more particularly, to a method for adjusting a characteristic impedance for a semiconductor package.

Advances in semiconductor wafer processing and packaging techniques have paved the way for the manufacture of high speed electronic systems including high speed computer systems, automatic test equipment, instrumentation, and communications systems. The packaged semiconductor devices used as components in these systems send and receive electrical signals at such high speeds that the interconnects through which the electrical signals travel must be treated as transmission lines having a characteristic impedance $Z_0$. An important parameter governing the characteristic impedance is the distance between a ground plane and the interconnect or signal line. For example, the characteristic impedance of a microstrip transmission line is approximated by the equation:

$$Z_0 = \frac{87}{\sqrt{e_r + 1.41}} \times \ln\left(\frac{5.98 \times h}{0.8 \times w + t}\right).$$

The parameters "w" and "t" refer to the width and the thickness, respectively, of a conductive finger and the parameters "h" and "$e_r$" refer to the thickness, and the relative dielectric constant, respectively, of a dielectric layer between a ground plane and the conductive finger. This formula applies when the ratio of "w" to "h" ranges between approximately 0.1 and approximately 3 and when the dielectric constant, $e_r$, ranges between approximately 1 and approximately 15.

TAB (Tape Automated Bonded) packages include a region, commonly referred to as a fan-out region, in which the impedance of a plurality of conductors must be controlled to ensure the proper operation of a semiconductor die housed by the TAB package. This impedance control is accomplished using a two-metal TAB tape in which the plurality of conductors are fabricated from a first metal layer and a ground plane for the plurality of conductors is fabricated from the second metal layer. A dielectric film is sandwiched between the two metal layers and provides the desired separation between the plurality of conductors and the ground plane, and thereby forms a microstrip transmission line having a characteristic impedance $Z_0$.

The two-metal TAB tape configuration is useful to the semiconductor manufacturer for testing the packaged semiconductor die and to "end-users" whose system design constraints permit using a packaged semiconductor die having an attached ground plane. However, for system designs in which the fan-out region is undesirable due to, for example, space constraints, the plurality of conductors must be severed near the semiconductor die such that the fan-out region and its attached ground plane are removed from the TAB package. In these types of applications, the ground plane is still used by semiconductor manufacturers for maintaining the characteristic impedance of the plurality of conductors while testing the packaged semiconductor die. Although including the ground plane by using a two-metal TAB tape is necessary for testing the TAB packaged semiconductor die, it increases the manufacturing costs associated with these components. Moreover, "end-users" who do not require the fan-out region are unwilling to pay for the extra costs incurred by using the additional metal layer.

Accordingly, it would be advantageous to have a method for electrically testing a packaged semiconductor die wherein a characteristic impedance of the plurality of conductors in the fan-out region is both controllable and adjustable. Moreover, the method should provide the desired features without increasing the time required to manufacture and test the packaged semiconductor die.

SUMMARY OF THE INVENTION

Briefly stated, the present invention includes a method and an apparatus for adjusting a characteristic impedance of a plurality of conductors extending from a semiconductor die. In this method a tape carrier for a semiconductor die is provided. The tape carrier comprises a film having first and second major surfaces, a region for receiving the semiconductor die, and a plurality of conductors disposed on the first major surface. A semiconductor die is bonded to the plurality of conductors. An independent conductive plane, which is mounted on a test station, is coupled with the plurality of conductors. The semiconductor die is electrically tested and the independent ground plane is subsequently de-coupled from the plurality of conductors.

DETAILED DESCRIPTION OF THE DRAWINGS

Figure 1:
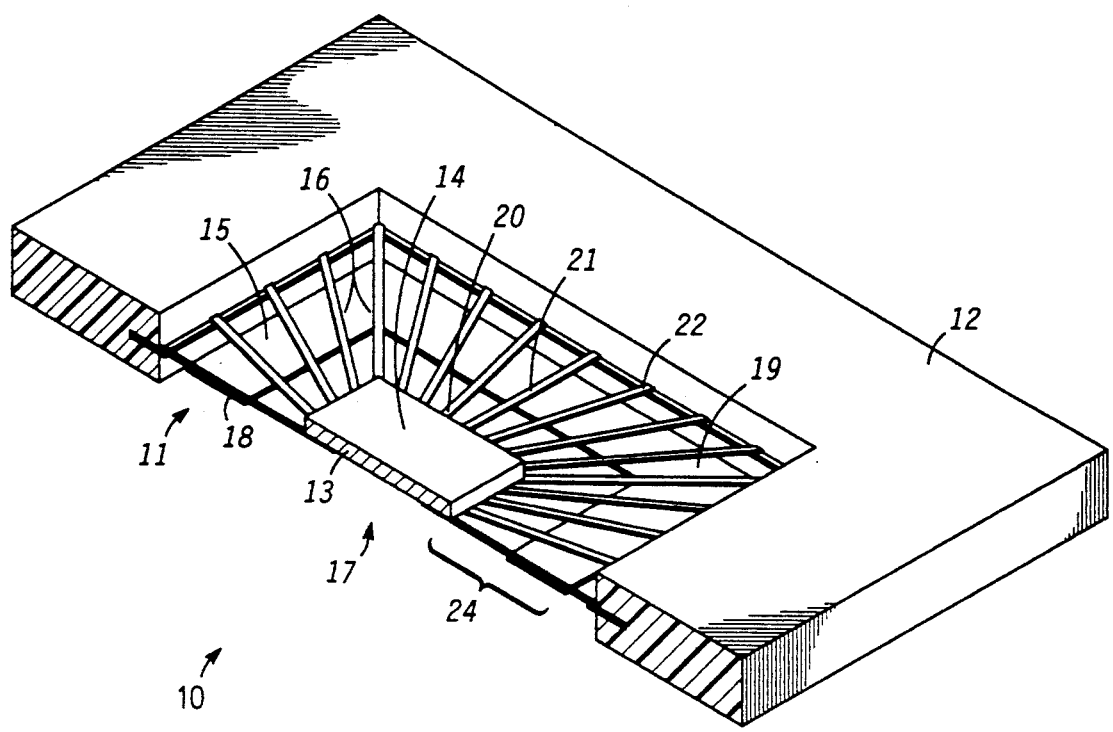
FIG. 1 illustrates a cross-sectional perspective view of a prior art TAB package.

One approach to packaging semiconductor die or housing high speed integrated circuits is mounting the die on leadframes in a process and a product known by the acronym "TAB" (Tape Automated Bonding). FIG. 1 illustrates a cross-sectional perspective view of a prior art TAB package 10 which comprises a TAB leadframe 11 mounted in a protective carrier 12. A semiconductor die 13 having a major surface and a plurality of bonding pads 9 disposed thereon (see FIGS. 2, 4, and 5) is bonded to TAB leadframe 11. Protective carrier 12 protects TAB leadframe 11 and semiconductor die 13 from damage during assembly, test, and transport operations. Leadframe 11 is also referred to as a tape carrier for a semiconductor die. Moreover, the semiconductor die may be referred to as a semiconductor chip.

TAB leadframe 11 comprises a rectangular shaped lead tape 15 having a first major surface 18 and a second major surface 19. Lead tape 15 has also been referred to as a tape or a film. In a first configuration of TAB leadframe 11, as shown in FIG. 1, a plurality of conductive fingers 16 is bonded to second major surface 19. Further, tape 15 has a centrally located aperture 17 which serves as a region for receiving semiconductor die 13. Since aperture 17 serves as a region for receiving semiconductor die 13, the shape of aperture 17 corresponds to that of semiconductor die 13. TAB leadframes such as leadframe 11 having a lead tape 15, wherein the lead tape has an aperture and a plurality of conductive fingers disposed thereon are also referred to as lead tape assemblies. Semiconductor die 13, having a backside 14, is bonded to the plurality of conductive fingers 16 such that backside 14 extends in an opposite direction than first major surface 18 faces. In FIG. 1, semiconductor die 13 is shown in an inverted orientation, thus backside 14 is facing upward. Aperture 17 has a rectangular shape wherein each side of aperture 17 is parallel to a corresponding side of tape 15.

Each conductive finger 16 extends from a side of aperture 17 to the corresponding parallel side of tape 15 and comprises a first end 20 which projects to aperture 17, a central portion 21, and a second end 22 which projects away from aperture 17. Thus, outer leads 22 are located distal from inner leads 20. First ends 20 and second ends 22 are commonly referred to as inner leads 20 and outer leads 22, respectively. Each inner lead 20 is bonded to at least one bonding pad on semiconductor die 13. Each outer lead 22 contacts a corresponding conductor on a test contact fixture 29 (shown in FIG. 2). Conductive fingers 16 are also referred to as leads, traces, conductive interconnects, conductors, etc.

The distance or pitch between adjacent conductive fingers 16 and the width of each conductive finger 16 must be sufficiently large to allow electrical contact between conductive fingers 16 and the corresponding conductors on the test contact fixture without the conductors of the test contact fixture electrically shorting conductive fingers 16 together. Currently available test contact fixtures can accommodate a pitch as small as approximately 0.203 millimeters (mm) between adjacent conductive fingers 16. However, the pitch between inner leads 20 of adjacent conductive fingers 16 is approximately 0.075 millimeters. Thus, conductive fingers 16 are routed such that the pitch between adjacent outer leads 22 is larger than that between adjacent inner leads 20. Since the pitch between adjacent conductive fingers 16 increases in the region between inner leads 20 and outer leads 22, this region is called the fan-out region 24.

Figure 2:
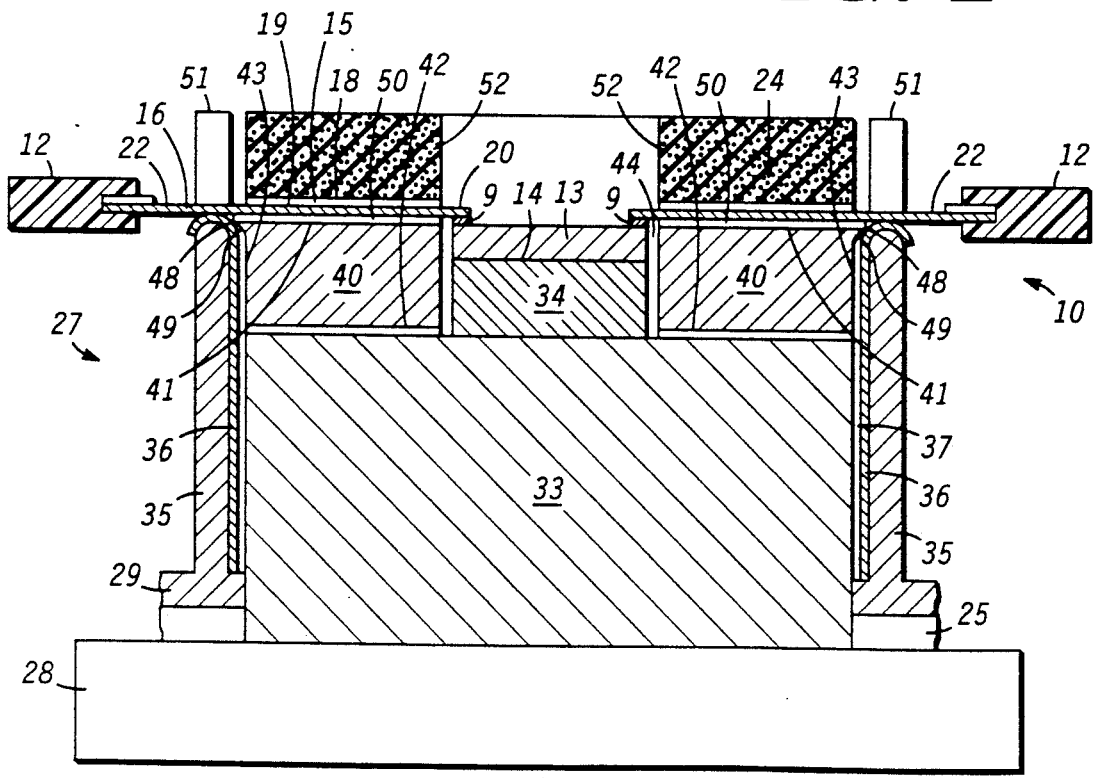
FIG. 2 illustrates a highly simplified cross-sectional view of a test station having a conductive plate in a first orientation in accordance with the present invention.

The speeds at which electrical signals travel through conductive fingers 16 are such that the conductive fingers must be treated as transmission lines. Thus, a conductive plane must be provided in fan-out region 24 to control the impedance of conductive fingers 16 and to provide the desired characteristic impedance $Z_0$ in conductive fingers 16. FIG. 2 illustrates a highly simplified cross-sectional view of a test station 27, or a test apparatus, which controls the impedance of conductive fingers 16 in accordance with the present invention. Test station 27 is comprised of a computer controlled automatic tester 28, a printed wiring interface board 25, a test contact fixture 29, and an independent conductive plate 40. A top surface 41 of conductive plate 40 serves as an independent conductive plane. Test contact fixture 29 is also referred to as a test fixture, a socket contactor, or a socket.

Automatic tester 28 includes a chuck 33 which extends through printed wiring interface board 25 and into test contact fixture 29. Preferably, chuck 33 is maintained at approximately room temperature and at a voltage potential approximately equal to that supplied by a system power supply having the lowest output voltage, for example $V_{EE}$ in ECL test applications. Chuck 33 has a thermally conductive pedestal 34 mounted thereon. Backside 14 of semiconductor die 13 rests on pedestal 34. Thus, chuck 33 in conjunction with pedestal 34 facilitates removal of heat from the TAB packaged semiconductor die. Automatic tester 28 may be, for example, a Schlumberger model "S-9000", an LTX "Trillium" tester, or the like. Testers such as computer controlled automatic tester 28 having a chuck 33 are well known in the art.

Test contact fixture 29 is mounted on printed wiring interface board 25 and printed wiring interface board 25 is mounted on automatic tester 28. One embodiment of test contact fixture 29 is described in U.S. Pat. No. 5,087,877 issued to Dieter R. Frentz et al on Feb. 11, 1992 and assigned to Motorola Inc., which is hereby incorporated herein by reference. Test contact fixture 29 includes a tape former 35 which is used to support and form a flexible printed circuit tape 36 into a predetermined shape. There is a tape former 35 along with printed circuit tape 36 on each of the four sides surrounding chuck 33. Printed circuit tape 36 provides a plurality of conductors on test station 27 to which semiconductor die 13 is coupled.

Figure 3:
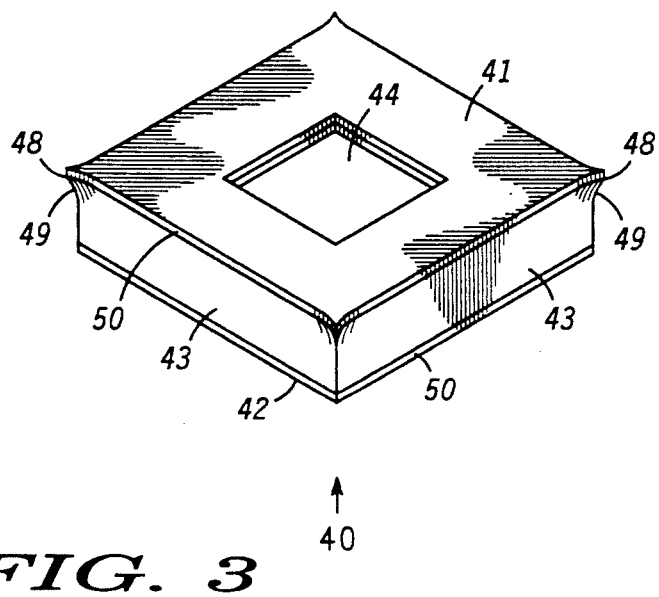
FIG. 3 illustrates a perspective view of a conductive plate in accordance with the present invention.

In accordance with the method of the present invention, independent conductive plate 40 is inserted below conductive fingers 16 and rests on chuck 33. FIG. 3 illustrates a perspective view of conductive plate 40 wherein conductive plate 40 has a top surface 41, a bottom surface 42, and sidewalls 43. In addition, conductive plate 40 includes an aperture 44 to accommodate both semiconductor die 13 and pedestal 34 (see FIG. 2). Top surface 41 and bottom surface 42 are also referred to as first and second major surfaces 41 and 42, respectively. Top surface 41 serves as an independent conductive plane. Although FIG. 3 shows sidewalls 43 as being straight, it shall be understood that sidewalls 43 may be flared near top surface 41, wherein sidewalls 43 follow the curvature of flexible printed circuit tape 36 thereby providing a conductive plane over flexible printed circuit tape 36 resulting in additional impedance control of flexible printed circuit tape 36.

Further, corners of top surface 41 extend outward forming lips 48. Although four lips 48 are shown, it shall be understood that there may be less than four lips. An underside 49 of each lip contacts a grounded portion of flexible printed circuit tape 36 thereby grounding conductive plate 40. Thus, independent conductive plate 40 is a removable portion of test station 27. Since top surface 41 of conductive plate 40 serves as a conductive plane, the conductive plane is also removable.

In a first example, conductive plane 41 serves as a ground plane and chuck 33 is at a potential $V_{EE}$. Conductive plane 41 and bottom surface 42 are coated with a layer of dielectric material 50 commonly referred to as a dielectric film. Dielectric material 50 may be polyimide, glass, plastic, or the like. Moreover, layer of dielectric material 50 may be formed as a nonconductive hard coat anodizing layer on conductive plate 40 such as, for example, anodized aluminum. Preferably, the thickness of dielectric material 50 provides a characteristic impedance in fan-out region 24 of FIG. 1 of approximately 50 ohms. For example, a microstrip transmission line comprising a conductive finger 16 (see FIG. 1) having a thickness of approximately 0.01778 millimeters (0.7 mils), a width of approximately 0.0508 millimeters (2 mils), and a dielectric material 50 of polyimide having a dielectric constant of approximately 3.8 and a thickness of approximately 0.0381 millimeters (1.5 mils) yields a characteristic impedance of approximately 52 ohms. It shall be understood that dielectric material 50 on bottom surface 42 merely serves to electrically isolate conductive plate 40 from chuck 33, which is at a potential $V_{EE}$.

In a second example, conductive plane 41 serves as a conductive plane for AC signals and is at the same potential as chuck 33. Thus, conductive plane 41, sidewalls 43, and underside 49 of lip 48 are coated with a layer of dielectric material 50, whereas bottom surface 42 is not coated with dielectric material. In this example conductive plane 41 may be a ground plane by setting chuck 33 at ground potential.

Referring again to FIG. 2, TAB package 10 of FIG. 1 is mounted on test station 27. More particularly, TAB package 10 is mounted to test contact fixture 29 of test station 27, wherein outer leads 22 of TAB package 10 contact corresponding leads on flexible printed circuit tape 36. Further, the portion of conductive fingers 16 which are in fan-out region 24 contact dielectric material 50, thereby coupling conductive plane 41 with the plurality of conductive fingers 16. Thus, dielectric material 50 on conductive plane 41 is adjacent to the plurality of conductive fingers 16. Semiconductor die 13 fits into aperture 44.

Conductive plane 41 cooperates with test contact fixture 29 to serve as a conductive plane for a device under test thereby forming a microstrip transmission line in the fan-out region 24. The microstrip transmission line comprises conductive plane 41, dielectric material 50, and conductive fingers 16. The characteristic impedance of conductive fingers 16 is controlled by the thickness of dielectric layer 50 and the thickness and width of conductive fingers 16.

Once TAB package 10 is mounted onto test contact fixture 29, a pressure pad 51 presses down on outer leads 22 thereby pressing outer leads 22 and test contact fixture 29 together. Pressure pad 51 ensures electrical contact between conductive fingers 16 and flexible printed circuit tape 36.

Since tape 15 is a flexible tape, it is desirable to apply a force on major surface 18 to ensure continuous contact along the interface formed between layer of dielectric material 50 and conductive fingers 16. In one example of a suitable means for applying a force on major surface 18, a nonconductive, resilient pressure pad 52 such as, for example, foam rubber or the like, presses down on major surface 18. The shape of the nonconductive, resilient pressure pad 52 corresponds to that of fan-out region 24. It shall be understood that the function of nonconductive resilient pressure pad 52 of ensuring continuous contact along the interface formed between layer of dielectric material 50 and conductive fingers 16 is not a limitation of the present invention. For example, the function of the nonconductive resilient pressure pad 52 may be realized by modifying test station 27 such that a pump creates a partial vacuum in cavity 37 resulting in conductive fingers 16 being pulled towards layer of dielectric material 50.

Once pressure pad 51 is in place, computer controlled automatic tester 28 is enabled and electrically tests semiconductor die 13. Preferably, semiconductor die 13 comprises an integrated circuit which is referred to as a device under test. Upon completion of the testing, TAB package 10 is removed from test contact fixture 29, thereby de-coupling conductive plane 41 from the plurality of conductive fingers 16 and permitting testing of another TAB packaged semiconductor die. Conductive plane 41 is separate from TAB package 10 or lead tape assembly 11 and remains with test station 27. Thus, the plurality of conductive fingers 16 are in temporary contact with dielectric layer 50 and conductive plate 40. In other words, independent conductive plane 41 is temporarily coupled with the plurality of conductive fingers 16.

Figure 4:
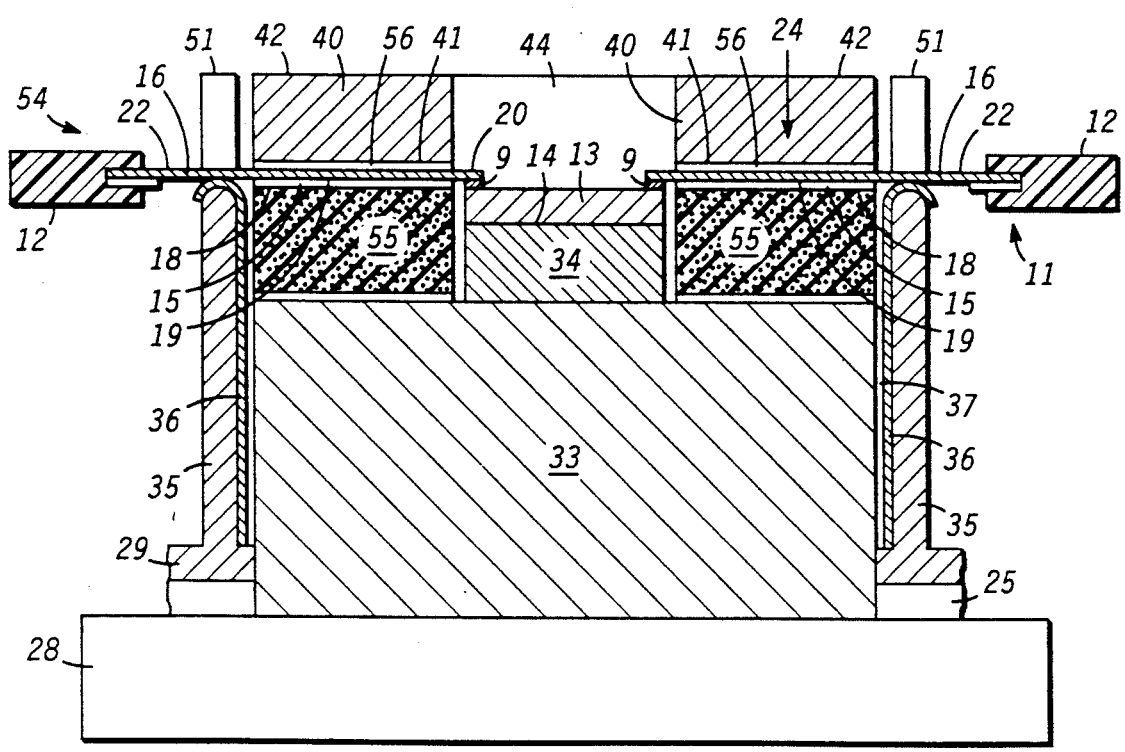
FIG. 4 illustrates a highly simplified cross-sectional view of a test station having a conductive plate in a second orientation in accordance with the present invention.

FIG. 4 illustrates test station 27 used in accordance with the method of the present invention to provide a ground plane for a TAB package 54 having a TAB leadframe 11 in a second or inverted configuration. In the second configuration, TAB leadframe 11 is mounted in protective carrier 12 in an inverted orientation relative to its mounting in TAB package 10 of FIG. 1. Semiconductor die 13 is bonded to the plurality of conductive fingers 16 such that backside 14 extends in the same direction that first major surface 18 faces. TAB package 54 is mounted on test station 27 such that first major surface 18 faces chuck 33 and the outer leads 22 of TAB package 54 contact corresponding leads on flexible printed circuit tape 36.

Top surface 41 of conductive plate 40 serves as a conductive plane and is coated with a layer of dielectric material 56. Dielectric material 56 may be, for example, polyimide, glass, plastic, or the like. Moreover, layer of dielectric material 56 may be formed as a nonconductive hard coat anodized layer on conductive plane 41 such as, for example, anodized aluminum.

Conductive plate 40 is placed on TAB package 54 such that layer of dielectric material 56 contacts conductive fingers 16 and couples conductive plate 40 with conductive fingers 16. Accordingly, dielectric material 56 on conductive plane 41 is adjacent to the plurality of conductive fingers 16. Further, conductive plate 40 is not inserted into aperture 37 as in the previous example. Bottom surface 42 may be grounded by coupling to a ground point (not shown) on test contact fixture 29 so that top surface 41 serves as a ground plane. Alternatively, top surface 41 may serve as an AC ground by connecting bottom surface 42 to a fixed voltage potential other than ground.

Placing conductive plate 40 on TAB package 54 forms a microstrip transmission line comprising conductive plane 41, layer of dielectric material 56, and conductive fingers 16. Preferably, the thickness of dielectric material 56 provides a characteristic impedance in the fan-out region of approximately 50 ohms. The technique for calculating the characteristic impedance of a microstrip transmission line is set out hereinbefore.

Once TAB package 10 is mounted onto test contact fixture 29, a pressure pad 51 presses down on outer leads 22 of leadframe 11 thereby pressing leadframe 11 and test contact fixture 29 together. Pressure pad 51 ensures electrical contact between conductive fingers 16 and flexible printed circuit tape 36. Again, due to the flexibility of tape 15 it is necessary to apply a force on major surface 18 to ensure continuous contact along the interface formed between layer of dielectric material 56 and conductive fingers 16. Resilient nonconductive material 55 such as, for example, foam rubber, is placed on chuck 33 wherein the shape of the resilient nonconductive material corresponds to that of fan-out region 24.

As in the example using a leadframe 11 in the first configuration, computer controlled automatic tester 28 is enabled and electrically tests the semiconductor die 13 once pressure pad 51 is in place. Upon completion of the testing, TAB package 54 is removed from test station 27 so that another semiconductor die packaged in a TAB package 54 may be tested. Although conductive plane 41 is removable, it is preferable that it remain with test station 27 during testing of semiconductor die.

Figure 5:
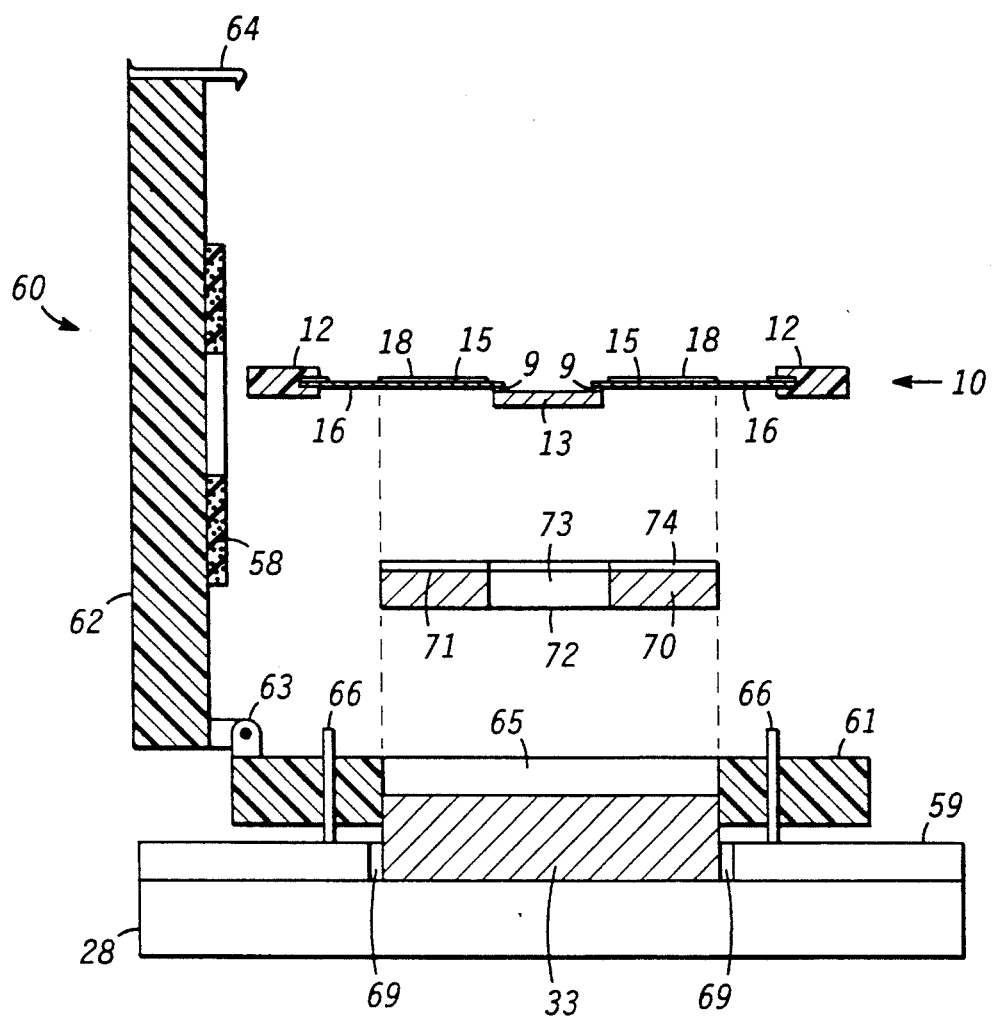
FIG. 5 illustrates a highly simplified, exploded cross-sectional view of another version of a test station having a conductive plate in accordance with the present invention.

FIG. 5 illustrates another version of a test station shown as a highly simplified exploded cross-sectional view, wherein the test station includes a test contact fixture 60. Test contact fixture 60 comprises a base 61, a cover 62, a hinge 63, and a latch 64. In the example shown in FIG. 5, cover 62 includes a resilient nonconductive pressure pad 58 for applying a force on surface 18 of tape 15 when cover 62 is closed. This force ensures continuous contact along the interface formed between layer of dielectric material 74 and conductive fingers 16.

Base 61 has a plurality of conductive interconnects 66 extending therethrough, which have one end that mates with a printed wiring interface board 59 and another end for mating with a TAB package, such as TAB package 10 or 54 discussed hereinbefore. Printed wiring interface board 59 is mounted on computer controlled automatic tester 28 and has an aperture 69 through which a chuck 33 extends. Further, base 61 has an aperture 65 through which 33 may extend. Test contact fixtures having these features are well known in the art.

In accordance with the method of the present invention, a conductive plate 70 is mounted on base 61, thereby covering a portion of aperture 65. Conductive plate 70 has a top side 71, a bottom side 72, and an aperture 73 through which a semiconductor die 13 may be inserted. Top side 71, which forms a conductive plane, is coated with a layer of dielectric material 74. Layer of dielectric material 74 may be, for example, hard coat anodized aluminum, polyimide, glass, plastic, or the like.

Bottom side 72 is mounted to base 61 such that conductive plate 70 is not electrically shorted with conductive interconnects 66. Preferably, a ground plane is formed from top side 71 by connecting bottom side 72 to ground.

A TAB package 10, having the first configuration as shown in FIG. 1, is placed in test contact fixture 60. Cover 62 is closed and fastened shut with latch 64. Closing cover 62 contacts layer of dielectric material 74 with the plurality of conductive fingers 16, thereby coupling conductive plane 71 with the plurality of conductive fingers 16. In addition, nonconductive, resilient pressure pad 58 presses major surface 18 against conductive fingers 16 thereby ensuring continuous contact along the interface formed between layer of dielectric material 74 and conductive fingers 16. Conductive plate 70 provides a ground plane thereby forming a microstrip transmission line comprising conductive fingers 16, dielectric material 74, and conductive plane 71. Once cover 62 is closed, computer controlled automatic tester 28 is enabled and semiconductor die 13 is electrically tested. Upon completion of the electrical tests, TAB package 10 is removed from test contact fixture 60 to allow testing of other TAB packages 10. Conductive plane 71 is separate from TAB package 10 or lead tape assembly 11, and remains with test contact fixture 60 after removal of TAB package 10 from test contact fixture 60.

For a TAB package 54 in accordance with the second configuration as shown in FIG.4, test contact fixture 60 may be modified to have conductive plate 70 built into cover 62 and the nonconductive resilient pressure pad 58 extending from base 61. Thus, when cover 62 is closed a microstrip transmission line is formed comprising conductive fingers 16, dielectric material 74, and conductive plate 70.

By now it should be appreciated that a method for controlling and adjusting the characteristic impedance of conductive fingers in a TAB package using a test station has been provided. A microstrip transmission line is formed in a fan-out region of the TAB package by providing a conductive plane to this region. The microstrip transmission line comprises a conductive finger of the TAB package, a dielectric material, and the conductive plane. The conductive plane is formed from a conductive plate which is mounted to or inserted in a test contact fixture. Although the conductive plane cooperates with the TAB package, it is separate from the TAB package. Thus, the present invention provides a conductive plane, such as a ground plane, for TAB tapes having a single layer of metal. Eliminating the need for a conductive plane in the TAB package saves money and reduces the number of processing steps required to manufacture a TAB packaged semiconductor die.

In addition, the use of the conductive plate provides a method for adjusting the characteristic impedance independent of the TAB package by changing the thickness of the dielectric layer on the conductive plate. Thus the thickness of the dielectric layer may be changed to provide a desired characteristic impedance.

We claim:

1. A method for adjusting a characteristic impedance, comprising the steps of:
    providing a tape carrier for a semiconductor die, the tape carrier comprising a film having a first major surface, a second major surface, a region for receiving the semiconductor die, and a plurality of conductors on the first major surface, each of the plurality of conductors having a first end projecting to the region for receiving the semiconductor die, a central portion, and a second end projecting away from the region for receiving the semiconductor die;
    providing the semiconductor die, the semiconductor die having a first major surface and a plurality of bonding pads on the first major surface;
    bonding the first end of each of the plurality of conductors to at least one of the plurality of bonding pads;
    providing an independent conductive plane, the independent conductive plane having a first major surface and a second major surface wherein the independent conductive plane is separate from the tape carrier and is a removable portion of a test apparatus;
    coupling the independent conductive plane with the central portion of the plurality of conductors;
    electrically testing the semiconductor die; and
    de-coupling the independent conductive plane from the central portion of the plurality of conductors wherein the independent conductive plane remains with the test apparatus.

2. A method for adjusting a characteristic impedance as claimed in claim 1 wherein the step of providing an independent conductive plane includes providing an independent conductive plane having a dielectric coating on at least the first major surface.

3. A method for adjusting a characteristic impedance as claimed in claim 2 wherein the step of coupling the independent conductive plane with the central portion includes placing the dielectric coating on the at least first major surface adjacent to the plurality of conductors.

4. A method for adjusting a characteristic impedance as claimed in claim 1 wherein the step of coupling the independent conductive plane with the central portion of plurality of conductors includes pressing on the first major surface of the tape carrier with a nonconductive resilient pressure pad.

5. A method for adjusting a characteristic impedance as claimed in claim 1 wherein the step of providing an independent conductive plane includes providing an independent conductive plane having an aperture.

6. A method for adjusting a characteristic impedance as claimed in claim 1 wherein the step of providing a tape carrier for a semiconductor die includes providing a film having an aperture for receiving the semiconductor die.

7. A method for controlling an impedance within a TAB package, comprising the steps of:

provSynaptic a lead tape assembly comprising a lead tape, the lead tape having an aperture for receiving a semiconductor chip and a plurality of conductive-fingers for electrically connecting the semiconductor chip to a test apparatus, wherein the semiconductor chip has a plurality of bonding pads and the test apparatus has a corresponding plurality of conductors, each conductive finger having an inner lead for bonding to at least one of the plurality of bonding pads and an outer lead distally located from the inner lead for contacting a corresponding conductor on the test apparatus, and wherein the area between the inner lead and the outer lead forms a fan-out region;

providing a conductive plane, wherein the conductive plane is separate from the lead tape assembly and has at least one major surface;

coating the at least one major surface of the conductive plane with a dielectric film;

temporarily placing the conductive plane in the test apparatus; and placing the plurality of conductive fingers in temporary contact with the dielectric film.

8. A method for controlling an impedance within a TAB package as claimed in claim 7 wherein the step of coating includes providing a hard coat anodized layer on the at least one major surface of the conductive plane.

9. A method for controlling an impedance within a TAB package as claimed in claim 7 wherein the step of coating includes coating the at least one major surface of the conductive plane with polyimide having a thickness of approximately 38.1 micrometers (approximately 1.5 mils).

10. A method for controlling an impedance within a TAB package as claimed in claim 7 wherein the step of providing a conductive plane includes providing a conductive plane comprising aluminum.

11. A method for controlling an impedance within a TAB package as claimed in claim 7 wherein the step of placing the plurality of conductive fingers in temporary contact with the dielectric film includes performing an electrical test with the test apparatus, and subsequently separating the plurality of conductive fingers from the dielectric film, wherein the conductive plane and the dielectric film remain with the test apparatus.

12. A method for controlling an impedance within a TAB package as claimed in claim 7 wherein the step of temporarily placing the conductive plane in the test apparatus includes temporarily placing the conductive plane in a TAB test contact fixture.

13. A method for controlling an impedance within a TAB package as claimed in claim 7 wherein the step of placing the plurality of conductive fingers in temporary contact with the dielectric film includes setting the conductive plane at a ground potential.

* * * * *